(12) United States Patent
Rouh

(10) Patent No.: US 7,785,945 B2
(45) Date of Patent: Aug. 31, 2010

(54) METHOD FOR FABRICATING PMOS TRANSISTOR

(75) Inventor: Kyoung Bong Rouh, Icheon-si (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/491,983

(22) Filed: Jun. 25, 2009

(65) Prior Publication Data
US 2010/0167483 A1 Jul. 1, 2010

(30) Foreign Application Priority Data
Dec. 26, 2008 (KR) ............... 10-2008-0134801

(51) Int. Cl.
*H01L 21/338* (2006.01)
(52) U.S. Cl. ............... 438/179; 438/563; 257/E21.135
(58) Field of Classification Search ............. 438/179, 438/286, 563, FOR. 175, FOR. 190; 257/E21.056, 257/E21.135, E21.141
See application file for complete search history.

(56) References Cited

U.S. PATENT DOCUMENTS
6,667,206 B2 12/2003 Sayama

2008/0048267 A1 * 2/2008 Richardson et al. ......... 257/365
2008/0122017 A1 5/2008 Park

* cited by examiner

*Primary Examiner*—W. David Coleman
(74) *Attorney, Agent, or Firm*—Marshall, Gerstein & Borun LLP

(57) ABSTRACT

A method for fabricating a PMOS transistor is disclosed herein. In one embodiment, the method can include forming a gate insulation layer and a polysilicon layer over a semiconductor substrate; asymmetrically etching the polysilicon layer; doping the asymmetrically etched polysilicon layer with a P-type dopant; diffusing the dopant in the asymmetrically etched polysilicon layer towards the semiconductor substrate; planarizing the asymmetrically etched polysilicon layer; forming a gate metal layer over the planarized polysilicon layer; forming a hard mask, which delimits a region to be formed with a gate of the PMOS transistor, over the gate metal layer; forming a gate stack by patterning the gate metal layer, the planarized polysilicon layer, and the gate insulation layer; and forming a source/drain in the semiconductor substrate at both sides of the gate stack.

17 Claims, 4 Drawing Sheets

METHOD FOR FABRICATING PMOS TRANSISTOR

CROSS-REFERENCE TO RELATED APPLICATION

Priority to Korean patent application No. 10-2008-0134801, filed Dec. 26, 2008, the disclosure of which is incorporated herein by reference in its entirety, is claimed.

BACKGROUND OF THE INVENTION

1. Field of the Invention

The invention relates to a method for fabricating a semiconductor device, and more particularly, to a method for fabricating a PMOS transistor capable of preventing boron (B) ions of a gate from penetrating into a semiconductor substrate without deterioration of a gate oxide layer.

2. Brief Description of Related Technology

Polysilicon is commonly used as a material for forming a gate of a semiconductor device. Polysilicon has the physical properties, such as a high melting point, easiness of thin film forming and line pattern forming, required for the gate material. Conventionally, in both NMOS and PMOS transistors, the gate is formed of the polysilicon doped with an N-type dopant to simplify the process. Thus, a buried channel is formed in the PMOS transistor. However, as design rule of a semiconductor chip is decreased and low power consumption and high speed operation are required, the PMOS transistor having the buried channel has limitation. To overcome this limitation a dual gate process has been developed, in which the polysilicon doped with an N-type dopant is used in an NMOS region and the polysilicon doped with a P-type dopant is used in a PMOS region.

If the PMOS transistor is changed into a surface channel structure, a current on/off ratio and a role off property of a short channel threshold voltage are improved. To make the PMOS transistor as a surface channel structure, the gate is formed with the polysilicon doped with $P^+$ dopant instead of the polysilicon doped with $N^+$ dopant. Conventionally, to simplify the process, a polysilicon layer is doped with an N-type dopant, and a P-type dopant is then doped into the polysilicon layer in the PMOS transistor region by ion implantation or plasma doping, is used.

However, in this case, a boron (B) ion, a P-type dopant, passes through the gate oxide layer and penetrates into the surface of the semiconductor substrate. When the boron (B) ion penetrates into the semiconductor substrate, it changes the doping concentration inside the semiconductor substrate, which results in a phenomenon that can prevent the semiconductor device from operating normally. To prevent this phenomenon, the surface of the gate oxide layer is nitrified after the gate oxide layer is formed, which prevents the penetration of the boron (B) ion from the doped polysilicon layer. However, the boron (B) ion penetration is still not completely prevented. Also, the nitrification of the gate oxide layer can degrade the layer quality of the gate oxide layer. Consequently, the gate oxide layer can have a structure that is susceptible to a hot carrier effect, which results in deterioration of semiconductor device properties.

SUMMARY OF THE INVENTION

Embodiments of the invention are directed to a method for fabricating a PMOS transistor capable of preventing penetration of boron (B) ion from a gate into a semiconductor substrate without deterioration of a gate oxide layer.

In one embodiment of the invention, a method for fabricating a PMOS transistor includes: forming a gate insulation layer and a polysilicon layer over a semiconductor substrate; asymmetrically etching the polysilicon layer to form an asymmetrically etched polysilicon layer; doping the asymmetrically etched polysilicon layer with a P-type dopant; diffusing the dopant in the asymmetrically etched polysilicon layer towards the semiconductor substrate; planarizing the asymmetrically etched polysilicon layer to form a planarized polysilicon layer; forming a gate metal layer over the planarized polysilicon layer; forming a hard mask, which defines a region to be formed with a gate of the PMOS transistor, over the gate metal layer; forming a gate stack by patterning the gate metal layer, the planarized polysilicon layer, and the gate insulation layer; and forming a source/drain in the semiconductor substrate at both sides of the gate stack.

In another embodiment of the invention, a method for fabricating a PMOS transistor includes: forming a gate insulation layer and a polysilicon layer over a semiconductor substrate; asymmetrically etching the polysilicon layer to form an asymmetrically etched polysilicon layer; doping the asymmetrically etched polysilicon layer with a P-type dopant; diffusing the dopant in the asymmetrically etched polysilicon layer towards the semiconductor substrate; forming a gate metal layer over the asymmetrically etched polysilicon layer; planarizing a surface of the gate metal layer to form a planarized gate metal layer; forming a hard mask, which defines a region to be formed with a gate of the PMOS transistor, over the planarized gate metal layer; forming a gate stack by patterning the gate metal layer, the asymmetrically etched polysilicon layer, and the gate insulation layer; and forming a source/drain in the semiconductor substrate at both sides of the gate stack.

DETAILED DESCRIPTION OF SPECIFIC EMBODIMENTS

In general, penetration of boron (B) ions and deterioration of the layer quality of a gate oxide layer have a trade-off relationship. That is, in order to prevent the boron (B) ions implanted in the polysilicon layer from penetrating into a semiconductor substrate, a concentration of nitrogen in a process of nitrifying a surface of the gate oxide layer is increased. However, when increasing the nitrogen concentration, the layer quality of the gate oxide layer may be deteriorated, resulting in the generation of hot carriers and decreased gate controllability. On the contrary, when decreasing the nitrogen concentration in the nitrification in order to ensure the layer quality of the gate oxide layer, the penetration of the boron (B) ions can be generated over an entire surface of the semiconductor substrate and a threshold voltage (Vt) of a transistor can consequently be varied.

Embodiments of the invention are directed to a method capable of decreasing the nitrogen concentration in the nitrification process performed for the reduction of the boron (B) ion penetration, while obtaining enhanced layer quality of the gate oxide layer and increased gate controllability.

FIGS. 1 through 5 are cross-sectional views illustrating a method for fabricating a PMOS transistor in accordance with an embodiment of the invention.

Figure 1:
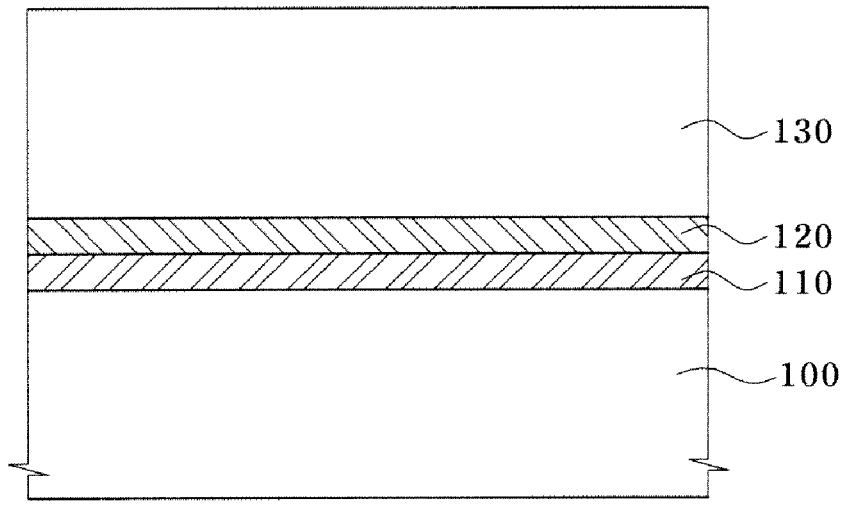
FIGS. 1 through 5 are cross-sectional views illustrating a method for fabricating a PMOS transistor in accordance with an embodiment of the invention.

Referring to FIG. 1, a gate insulation layer 110 is formed over a semiconductor substrate 100. The semiconductor substrate 100 can be, for example, a P-type silicon substrate. The gate insulation layer 110 can be formed, for example, by oxidizing a surface of the semiconductor substrate 100 and depositing, for example, an oxide layer, a nitride layer, or an oxynitride layer, using a well known method, such as, for example, Chemical Vapor Deposition (CVD), or by sequentially stacking an oxide layer/nitride layer/oxide layer (ONO) structure on the semiconductor substrate 100. Various methods, such as, for example, thermal oxidation, radical oxidation, wet or dry oxidation, and rapid thermal oxidation can be used as the oxidation method.

The semiconductor substrate 100 having the gate insulation layer 110 is nitrified for a predetermined time, for example, in a nitrogen gas atmosphere to form a nitride layer 120 over the surface of the gate insulation layer 110. The nitride layer 120 can be used to reduce the penetration of boron (B) ions from a polysilicon layer or a gate conductive layer into the semiconductor substrate 100. The nitrification process can be omitted, if necessary. A concentration of the nitrogen in the nitrification process is suitably controlled in consideration of the prevention of the penetration of the boron (B) ions and the deterioration of the layer quality of the gate insulation layer 110, which have a trade-off relationship, as described above.

A polysilicon layer 130 is deposited over the nitride layer 120 to a predetermined thickness to form a gate conductive layer. The polysilicon layer 130 can be formed, for example, of doped polysilicon or non-doped polysilicon. In the present embodiment, for example, the polysilicon layer 130 is formed of non-doped polysilicon. The polysilicon layer 130 is formed to a suitable thickness in consideration of a thickness to be removed by etching in a subsequent process.

Figure 2:
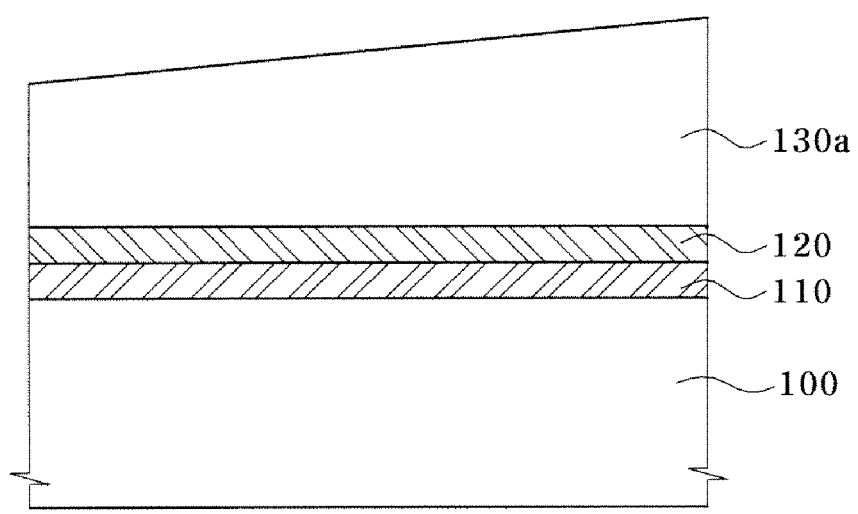

Referring to FIG. 2, after forming a photoresist pattern (not shown) that defines a region to be formed with a gate of the PMOS transistor, a portion of the polysilicon layer 130 in the region to be formed with the PMOS transistor is etched using the photoresist pattern as a mask. Next, the etched portion of the polysilicon 130 in the PMOS transistor region is asymmetrically etched to make the etched face of the polysilicon layer 130a asymmetrical, as is illustrated in FIG. 2. The angle between the etched face of the polysilicon layer 130a and the surface of the semiconductor substrate can be controlled to be, for example, in a range of 1° to 45°, according to desired device properties. As the result of asymmetrical etching, the thickness of one side of the asymmetrically etched polysilicon layer 130a is thicker than the other side of the asymmetrically etched polysilicon layer 130a to form an asymmetrical face. For example, the thickness of left side of the asymmetrically etched polysilicon layer 130a can be less than the thickness of the right side of the asymmetrically etched polysilicon layer 130a to form the asymmetrical face.

Figure 3:
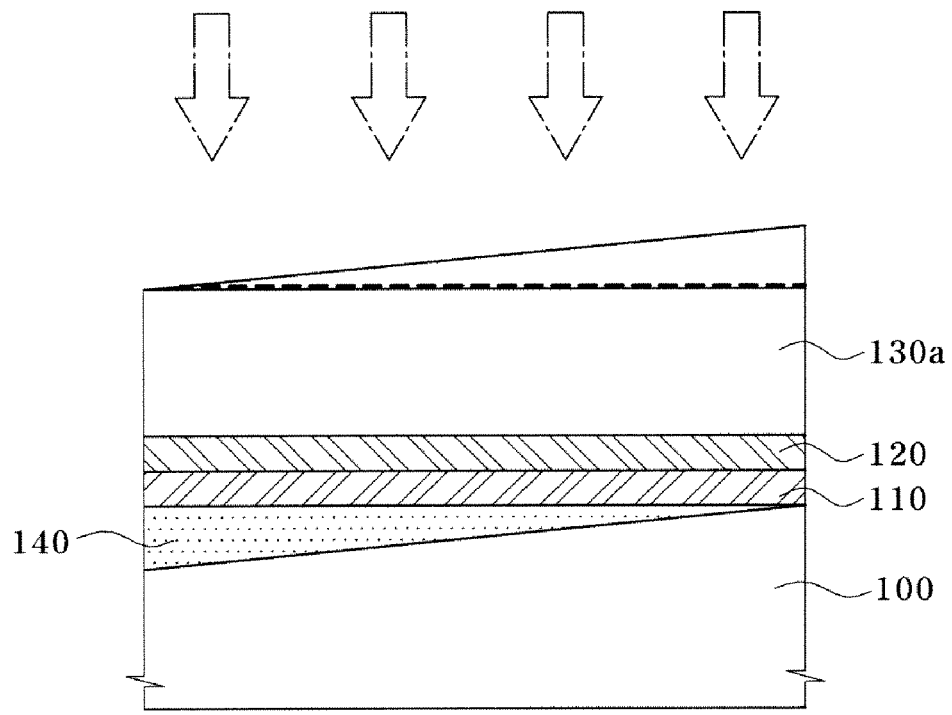

Referring to FIG. 3, the asymmetrically etched polysilicon layer 130a can be doped, for example, with a P-type dopant. For example, the semiconductor substrate 100 can be loaded into a plasma doping equipment, and then the asymmetrically etched polysilicon layer 130a can be doped using, for example, $BF_4$ gas. The thickness of the asymmetrically etched polysilicon layer 130a at a thinner side can be, for example, about 800 Å. The doping can be performed, for example, with an energy in a range of about 5 KeV to 7 KeV, and at a concentration, for example, in a range of about $5 \times 10^{15}$ atoms/cm$^2$ to $1 \times 10^{17}$ atoms/cm$^2$. Alternatively, the asymmetrically etched polysilicon layer 130a can be doped, for example, by implanting boron (B) ions using an ion implantation method. The dopant can be implanted, for example, using the same energy and/or concentration in the plasma doping method.

When the dopant is implanted into the asymmetrically etched polysilicon layer 130a, an impurity layer 140 is also formed asymmetrically, according to the angle of the asymmetrically etched polysilicon layer 130a.

After doping the asymmetrically etched polysilicon layer 130a, the semiconductor substrate 100 can be heat treated to diffuse and/or activate the implanted dopants. The heat treatment process can be performed, for example, as a rapid thermal process. The heat treatment process can activate and/or diffuse the dopants implanted in the asymmetrically etched polysilicon layer 130a toward the semiconductor substrate 100. As a result of the asymmetry of the asymmetrically etched polysilicon layer 130a, the implanted dopants are diffused toward the semiconductor substrate to form the asymmetrical impurity region 140, as shown in FIG. 3.

Figure 4:
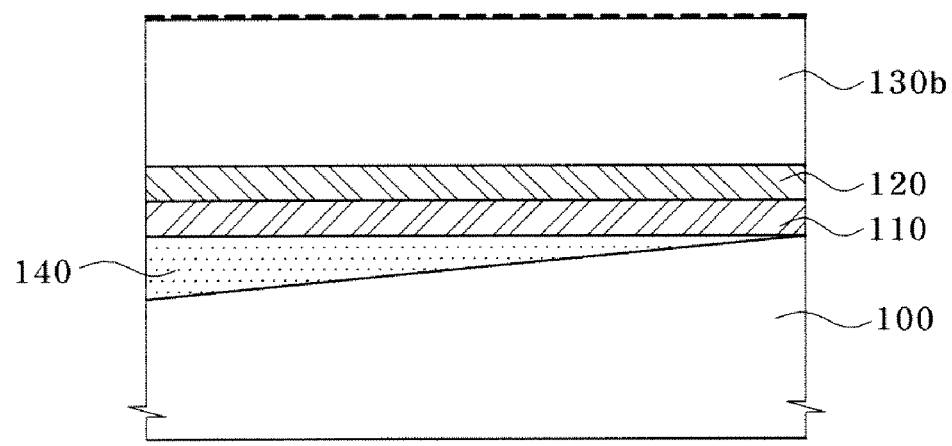

Referring to FIG. 4, a portion of the asymmetrically etched polysilicon layer 130a is removed to planarize the asymmetrically etched polysilicon layer 130a. For example, the asymmetrical surface of the polysilicon layer is removed to form a planarized polysilicon layer 130b having a uniform thickness. The asymmetrically etched polysilicon layer 130a can be planarized, for example, using Chemical Mechanical Polishing (CMP) and other planarization techniques.

The asymmetrically etched polysilicon layer 130a can be planarized, for example, by forming an etch stopper (not shown), such as an oxide layer or a nitride layer, on the thinner side of the asymmetrically etched polysilicon layer 130a. The etch stopper has a height substantially similar to the polysilicon layer The asymmetrically etched polysilicon layer 103a is etched using the etch stopper. The etch stopper is then removed. The, asymmetrical portion of the asymmetrically etched polysilicon layer 130a is removed, thereby planarizing the surface of the asymmetrically etched polysilicon layer 130a. As a result, the thickness of the asymmetrically etched polysilicon layer 130a is made uniform to form the planarized polysilicon layer 130b.

Figure 5:
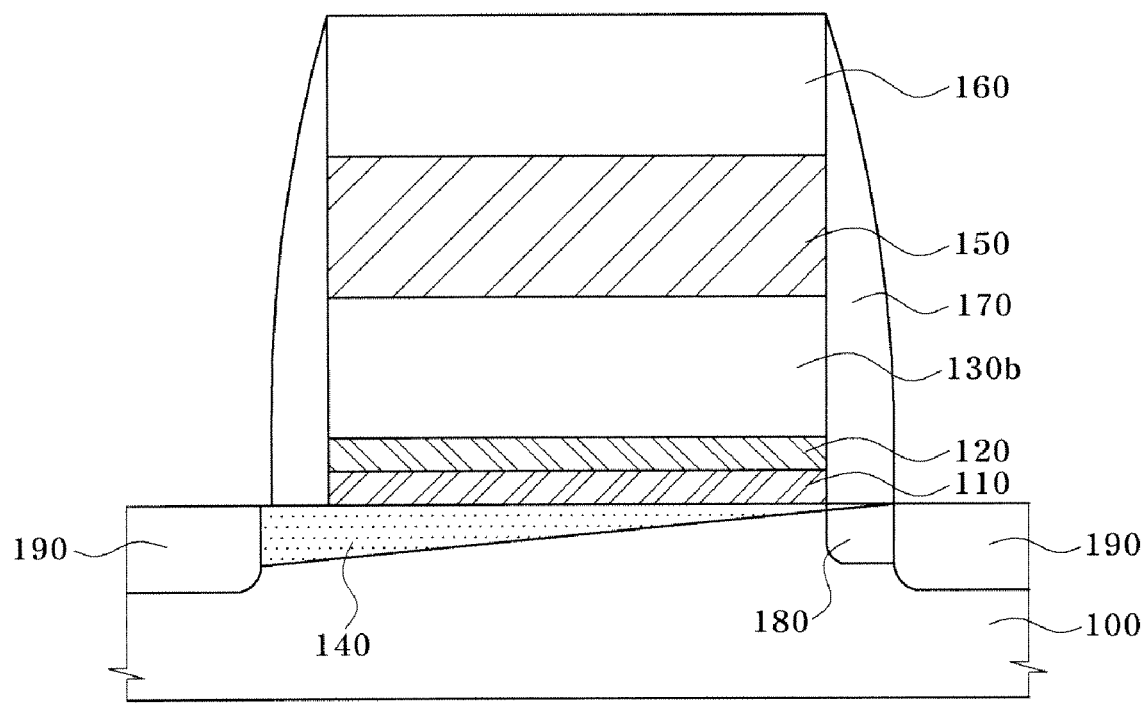

Referring to FIG. 5, a metal layer such as, for example, tungsten (W) or tungsten silicide (WSi), is deposited over the planarized polysilicon layer 130b to form a gate metal layer 150. A hard mask layer (not shown), for example, a nitride layer is deposited over the gate metal layer 150 and the hard mask layer is then patterned using, for example, a photo etching process using a photomask for a gate to form a hard mask 160. The hard mask 160 can also be formed, for example, of a material, which can be formed as a mask in an anisotropic etching process performed on the gate metal layer 150 and the planarized polysilicon layer 130b.

Using the hard mask 160 as an etch mask, the gate metal layer 150, the polysilicon layer 130b, the nitride layer 120, and the gate insulation layer 110 are sequentially etched to form a gate stack. An insulation layer (not shown) such as, for example, an oxide layer, can be deposited over the gate stack. The insulation layer can then be etched back to form a spacer 170 on a side wall of the gate stack. For example, spacers can be formed on both side walls of the gate stack. Next, a P-type dopant is implanted into the semiconductor substrate 100 at a high concentration to form a source/drain 190.

The asymmetrical impurity region 140 formed by penetration of the boron (B) ions is used as a lightly doped drain (LDD) region of a PMOS transistor. Therefore, when the impurity region 140 is formed shallowly at one side, for example, the right side, of the gate stack as shown in FIG. 5, or the concentration of the impurity region is low, a separate ion implantation for forming the LDD region 180 can be performed. In this case, after delimiting the region to be formed as the LDD region and prior to formation of the spacer 170 on the side wall of the gate stack, a P-type dopant such as boron (B) is ion implanted into the delimited region at a predetermined concentration. A separate halo ion implantation, for example, can be performed if the concentration of the impurity region 140 formed by the boron (B) ion penetration is too high.

Figure 6:
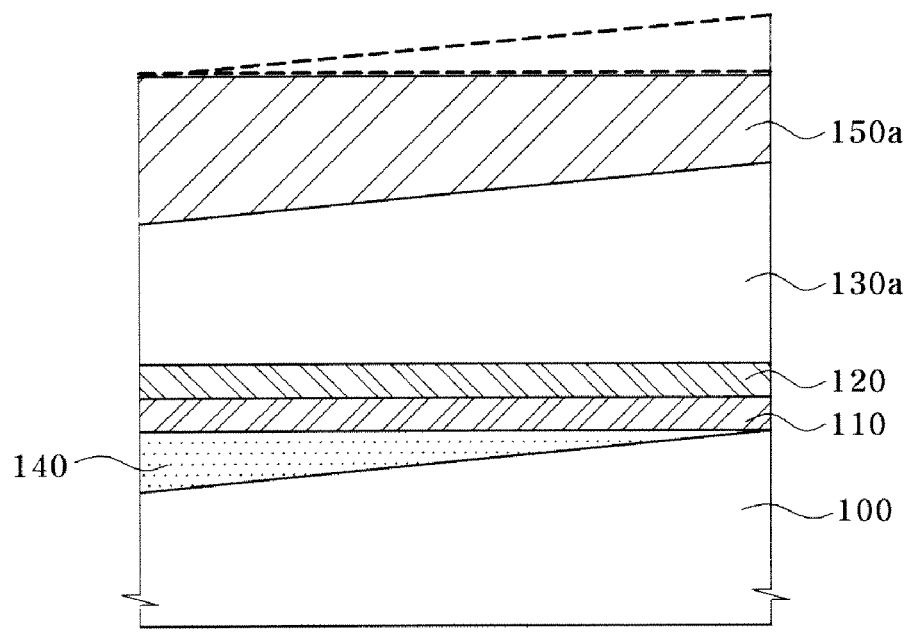
FIGS. 6 and 7 are cross-sectional views illustrating a method for fabricating a PMOS transistor in accordance with another embodiment of the invention.
Figure 7:
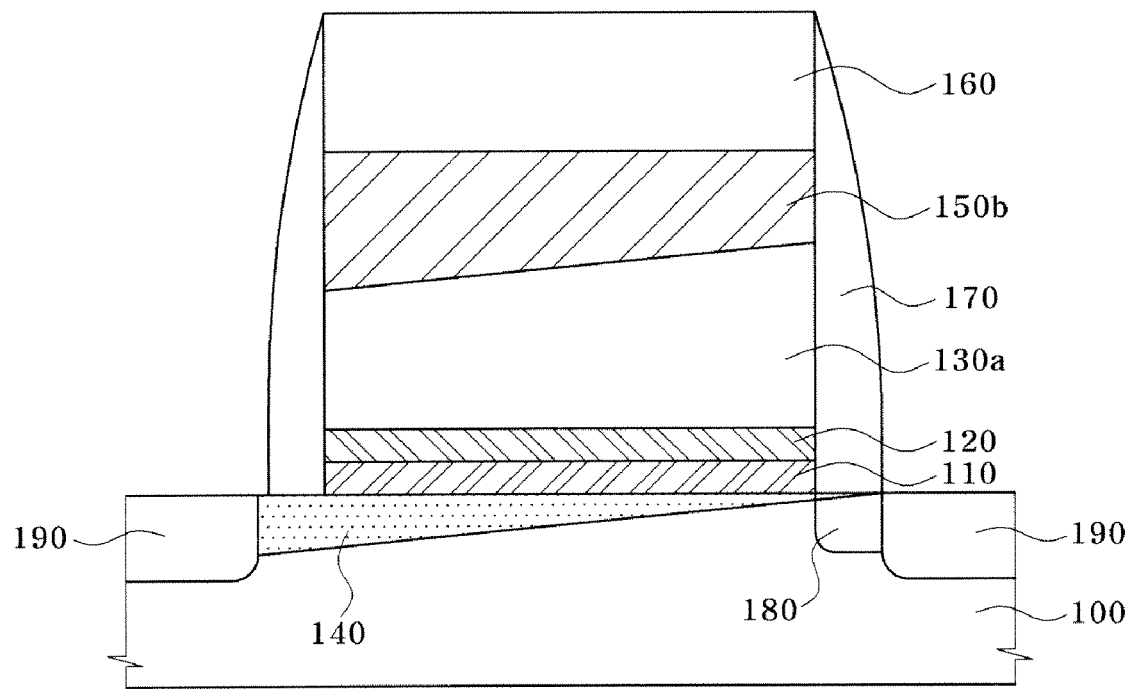

FIGS. 6 and 7 are cross-sectional views illustrating a method for fabricating a PMOS transistor in accordance with another embodiment of the invention. In FIGS. 6 and 7, the same reference numerals as used in the first embodiment are used to indicate the same elements.

Referring to FIG. 6, after the polysilicon layer deposited as the gate conductive layer is asymmetrically-etched and the asymmetrically etched polysilicon layer 130a is doped as in the first embodiment, the gate metal layer 150a is formed over the asymmetrical surface of the asymmetrically etched polysilicon layer 130a, thereby forming the gate layer 150a to be asymmetrical. Next, the asymmetrical gate metal layer 150 is planarized, using, for example, an etch back or CMP process. Planarization on the gate metal layer 150a can be performed, for example, in the same manner as the planarization process on the asymmetrically etched polysilicon layer 130a in the first embodiment.

Referring to FIG. 7, the hard mask 160 for gate patterning is formed over the planarized gate metal layer 150b, and processes of gate patterning and formation of source/drain can be performed, for example, in the same manner as in the first embodiment.

When forming the gate metal layer 150a over the asymmetrically etched polysilicon layer 130a without first planarizing the asymmetrically etched polysilicon layer 130a, drain induced barrier lowering can be improved. Also, it is possible that, after the polysilicon layer is asymmetrically-etched and the gate metal layer and the hard mask are then formed, etch back or CMP process is performed on the hard mask to planarize the surface of the gate stack.

As is apparent from the above description, in accordance with the invention, an asymmetric impurity region can be formed, for example, by implanting a dopant into a polysilicon layer or a gate conductive layer is asymmetrically etched to form an asymmetrical impurity region. By using the asymmetrical impurity region formed as such as a LDD region of a transistor, it can be possible to reduce a hot carrier effect. Therefore, it can be possible to reduce nitrification on a gate insulation layer performed for preventing dopant penetration and thus reduce deterioration of the gate insulation layer.

While the invention has been described with respect to the specific embodiments, it will be apparent to those skilled in the art that various changes and modifications may be made without departing from the spirit and scope of the invention as defined in the following claims.

What is claimed is:

1. A method for fabricating a PMOS transistor, comprising:
forming a gate insulation layer and a polysilicon layer over a semiconductor substrate;
asymmetrically etching the polysilicon layer to form an asymmetrically etched polysilicon layer;
doping the asymmetrically etched polysilicon layer with a P-type dopant to form an asymmetrically etched doped polysilicon layer;
diffusing the dopant in the asymmetrically etched doped polysilicon layer towards the semiconductor substrate;
planarizing the asymmetrically etched doped polysilicon layer to form a planarized polysilicon layer;
forming a gate metal layer over the planarized polysilicon layer;
forming a hard mask, which defines a region to be formed with a gate of the PMOS transistor, over the gate metal layer;
patterning the gate metal layer, the planarized polysilicon layer, and the gate insulation layer to form a gate stack; and
forming a source/drain in the semiconductor substrate at both sides of the gate stack.

2. The method of claim 1, wherein the polysilicon layer is asymmetrically etched such that an angle between an etched surface of the asymmetrically etched polysilicon layer and a surface of the semiconductor substrate is in a range of 1° to 45°.

3. The method of claim 1, wherein doping the asymmetrically etched polysilicon layer comprises performing a plasma doping or an ion implantation.

4. The method of claim 1, wherein doping the asymmetrically etched polysilicon layer comprises using an energy in a range of 5 KeV to 7 KeV and a dopant concentration in a range of $5 \times 10^{15}$ atoms/cm$^2$ to $1 \times 10^{17}$ atoms/cm$^2$.

5. The method of claim 1, wherein diffusing the dopant in the asymmetrically etched doped polysilicon layer comprises heat treating the semiconductor substrate including the asymmetrically etched doped polysilicon layer using a rapid thermal process.

6. The method of claim 1, wherein planarizing the asymmetrically etched doped polysilicon layer comprises:
forming an etch stopper at a side of the asymmetrically etched polysilicon layer;
etching the asymmetrically etched doped polysilicon layer until the etch stopper is exposed; and
removing the etch stopper.

7. The method of claim 1, further comprising, prior to forming the source/drain,
implanting a dopant for forming a lightly doped drain region into a portion of the semiconductor substrate having a low dopant concentration diffused from the asymmetrically etched doped polysilicon layer towards the semiconductor substrate.

8. The method of claim 1, further comprising, prior to forming the source/drain,
performing a halo ion implantation on a portion of the semiconductor substrate having a high dopant concentration diffused from the asymmetrically etched doped polysilicon layer towards the semiconductor substrate.

9. The method of claim 6, wherein etching the asymmetrically etched doped polysilicon layer comprises performing an etch back process or a chemical mechanical polishing process.

10. A method for fabricating a PMOS transistor, comprising:
forming a gate insulation layer and a polysilicon layer over a semiconductor substrate;
asymmetrically etching a predetermined thickness of the polysilicon layer to form an asymmetrically etched polysilicon layer;
doping the asymmetrically etched polysilicon layer with a P-type dopant to form an asymmetrically etched doped polysilicon layer;
diffusing the dopant in the asymmetrically etched doped polysilicon layer towards the semiconductor substrate;
forming a gate metal layer over the asymmetrically etched doped polysilicon layer;

planarizing a surface of the gate metal layer to form a planarized gate metal layer;

forming a hard mask, which defines a region to be formed with a gate of the PMOS transistor, over the plaraized gate metal layer;

patterning the planarized gate metal layer, the asymmetrically-etched doped polysilicon layer, and the gate insulation layer to form a gate stack; and forming a source/drain in the semiconductor substrate at both sides of the gate stack.

11. The method of claim 10, wherein the polysilicon layer is asymmetrically etched such that an angle between an etched surface of the asymmetrically etched polysilicon and a surface of the semiconductor substrate is in a range of 1° to 45°.

12. The method of claim 10, wherein doping the asymmetrically etched polysilicon layer comprises performing a plasma doping or an ion implantation.

13. The method of claim 10, wherein doping the asymmetrically etched polysilicon layer comprises using an energy in a range of 5 KeV to 7 KeV and a dopant concentration in a range of $5\times10^{15}$ atoms/cm$^2$ to $1\times10^{17}$ atoms/cm$^2$.

14. The method of claim 10, wherein diffusing the dopant in the asymmetrically etched doped polysilicon layer comprises heat treating the semiconductor substrate including the asymmetrically etched doped polysilicon layer using a rapid thermal process.

15. The method of claim 10, wherein asymmetrically etching the polysilicon layer comprises performing an etch back process or a chemical mechanical polishing process.

16. The method of claim 10, further comprising, prior to forming the source/drain, implanting a dopant for forming a lightly doped drain region into a portion of the substrate having a low dopant concentration diffused from the asymmetrically etched doped polysilicon layer towards the semiconductor substrate.

17. The method of claim 10, further comprising, prior to forming the source/drain, implementing a halo ion implantation on a portion of the substrate having a high dopant concentration diffused from the asymmetrically etched doped polysilicon layer towards the semiconductor substrate.

* * * * *